(12) United States Patent
Salling et al.

(10) Patent No.: US 6,627,955 B2
(45) Date of Patent: Sep. 30, 2003

(54) STRUCTURE AND METHOD OF MOS TRANSISTOR HAVING INCREASED SUBSTRATE RESISTANCE

(75) Inventors: Craig T. Salling, Plano, TX (US); Zhiqiang Wu, Plano, TX (US); Che-Jen Hu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/043,507

(22) Filed: Jan. 14, 2002

(65) Prior Publication Data
US 2002/0096716 A1 Jul. 25, 2002

Related U.S. Application Data
(60) Provisional application No. 60/263,619, filed on Jan. 23, 2001.

(51) Int. Cl.[7] .............................................. H01L 23/62
(52) U.S. Cl. ..................... 257/355; 257/345; 257/360; 257/655
(58) Field of Search ................................ 257/355, 345, 257/607, 616, 655, 360, 404

(56) References Cited

U.S. PATENT DOCUMENTS 6,249,025 B1 * 6/2001 Tyagi ......................... 257/345

* cited by examiner

*Primary Examiner*—Mark V. Prenty
(74) *Attorney, Agent, or Firm*—Gary C. Honeycutt; W. James Brady, III; Frederick J. Telecky, Jr.

(57) ABSTRACT

Structure and fabrication method of a lateral MOS transistor, positioned on the surface of an integrated circuit fabricated in a semiconductor of a first conductivity type, comprising a source and a drain, each having at the surface a region of the opposite conductivity type extending to the centrally located gate, defining the active area of said transistor; and a semiconductor region within said semiconductor of the first conductivity type, having a resistivity higher than the remainder of the semiconductor, this region extending vertically below the transistor while laterally limited to the area of the transistor such that the resistivity under the gate is different from the resistivity under the source and drain regions.

9 Claims, 6 Drawing Sheets

STRUCTURE AND METHOD OF MOS TRANSISTOR HAVING INCREASED SUBSTRATE RESISTANCE

This application claims priority under 35 U.S.C. §119 based upon Provisional Patent Application No. 60/263,619 filed Jan. 23, 2001.

FIELD OF THE INVENTION

The present invention is related in general to the field of electronic systems and semiconductor devices, and more specifically to structure and fabrication methods of MOS transistors, which have an increased substrate resistance compared to standard technology.

DESCRIPTION OF THE RELATED ART

Integrated circuits (ICs) may be severely damaged by electrostatic discharge (ESD) events. A major source of ESD exposure to ICs is from the charged human body ("Human Body Model", HBM); the discharge of the human body generates peak currents of several amperes to the IC for about 100 ns. A second source of ESD is from metallic objects ("machine model", MM); it can generate transients with significantly higher rise times than the HBM ESD source. A third source is described by the "charged device model" (CDM), in which the IC itself becomes charged and discharges to ground in the opposite direction than the HBM and MM ESD sources. More detail on ESD phenomena and approaches for protection in ICs can be found in A. Amerasekera and C. Duvvury, "ESD in Silicon Integrated Circuits" (John Wiley & Sons LTD. London 1995), and C. Duvvury, "ESD: Design for IC Chip Quality and Reliability" (Int. Symp. Quality in El. Designs, 2000, pp. 251–259; references of recent literature).

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an NMOS device whose drain is connected to the pin to be protected and whose source is tied to ground. The protection level or failure threshold can be set by varying the NMOS device width from the drain to the source under the gate oxide of the NMOS device. Under stress conditions, the dominant current conduction path between the protected pin and ground involves the parasitic bipolar transistor of that NMOS device. This parasitic bipolar transistor operates in the snapback region under pin positive with respect to ground stress events.

The dominant failure mechanism, found in the NMOS protection device operating as a parasitic bipolar transistor in snapback conditions, is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak NMOS device temperature, at which second breakdown is initiated, is known to increase with the stress current level.

Many circuits have been proposed and implemented for protecting ICs from ESD. One method that is used to improve ESD protection for ICs is biasing the substrate of ESD protection circuits on an IC. Such substrate biasing can be effective at improving the response of a multi-finger MOS transistor that is used to conduct an ESD discharge to ground. However, substrate biasing can cause the threshold voltages for devices to change from their nominal values, which may affect device operation. In addition, substrate biasing under steady-state conditions causes heat generation and increases power losses.

Solutions offered in known technology require additional IC elements, silicon real estate, and/or process steps (especially photomask alignment steps). Their fabrication is, therefore, expensive. Examples of device structures and methods are described in U.S. Pat. No. 5,539,233, issued Jul. 23, 1996 (Amerasekera et al., "Controlled Low Collector Breakdown Voltage Vertical Transistor for ESD Protection Circuits"); U.S. Pat. No. 5,793,083, issued Aug. 11, 1998 (Amerasekera et al., "Method for Designing Shallow Junction, Salicided NMOS Transistors with Decreased Electrostatic Discharge Sensitivity"); U.S. Pat. No. 5,940,258, issued Aug. 17, 1999 (Duvvury, "Semiconductor ESD Protection Circuit"); U.S. Pat. No. 6,137,144, issued Oct. 24, 2000, and U.S. Pat. No. 6,143,594, issued Nov. 7, 2000 (Tsao et al, "On-Chip ESD Protection in Dual Voltage CMOS); and U.S. patent application Ser. No. 09/456,036, filed Dec. 3, 1999 (Amerasekera et al., "Electrostatic Discharge Device and Method").

The influence of substrate well profiles on the device ESD performance is investigated, for instance, in "Influence of Well Profile and Gate Length on the ESD Performance of a Fully Silicided 0.25 $\mu$m CMOS Technology" (K. Bock, C. Russ, G. Badenes, G. Groeseneken and L. Deferm, Proc. EOS/ESD Symp., 1997, pp. 308–315). However, known technology recommends only a lower epitaxial doping or a lower implant dose as methods to increase the p-well resistance.

The challenge of cost reduction implies a drive for minimizing the number of process steps, especially a minimum number of photomask steps, and the application of standardized process conditions wherever possible. These constraints should be kept in mind when additional process steps or new process conditions are proposed to improve ESD insensitivity without sacrificing any desirable device characteristics. An urgent need has, therefore, arisen for a coherent, low-cost method of enhancing ESD insensitivity without the need for additional, real-estate consuming protection devices. The device structure should further provide excellent electrical performance, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

A structure of a lateral MOS transistor is described, positioned on the surface of an integrated circuit fabricated in a semiconductor of a first conductivity type, comprising a source and a drain, each having at the surface a region of the opposite conductivity type extending to the centrally located gate, defining the active area of said transistor; and a semiconductor region within said semiconductor of the first conductivity type, having a resistivity higher than the remainder of the semiconductor, this region extending vertically below the transistor while laterally limited to the area of the transistor such that the resistivity under the gate is different from the resistivity under the source and drain regions.

The invention applies to semiconductors both of p-type and n-type as "first" conductivity types; preferably, the semiconductors are in the 1 to 50 Ωcm resistivity range. The semiconductor may consist of an epitaxial layer deposited on higher conductivity substrate material.

It is an aspect of the invention that the region of higher resistivity is the substrate of the transistor, enabling full functioning of the transistor while not affecting operation of neighboring active devices.

Another aspect of the invention is that the region of higher resistivity improves the ESD protection of the transistor without decreasing latch-up robustness or increasing inadvertent substrate current-induced body biasing of neighboring transistors.

The method of fabricating the region of higher resistivity under the active area of a high-voltage NMOS transistor having a gate comprises the steps of depositing a photoresist layer over the transistor and opening a window in this layer over the active area of the transistor; then implanting, at high energy, n-doping ions into the p-type semiconductor substrate through the window, creating a deep region having a net p-type doping lower than that of the p-type semiconductor remote from the transistor active area.

It is an essential aspect of the present invention that this high-energy ion implant is performed without the need for a new photomask step, since the needed photomask has already been created in a previous ion implant step and is simply re-used. This economical feature renders the additional high-energy ion implant step of the present invention exceedingly inexpensive.

It is a technical advantage of the present invention that there are two options for performing the high-energy ion implant step. This step can either be performed after a preceding low-energy implant step (needed for defining the extended source and drain of the transistor), or after a preceding medium-energy implant step (needed for defining the deep source and drain of the transistor).

Another technical advantage of the present invention is the opportunity to implant the high-energy ions so that the peak concentration is at a different depth than that of the p-type semiconductor, and to select the dose so that it overcompensates the p-type semiconductor doping. A region of the opposite conductivity can thus be created, offering a device design for further increasing the p-type substrate resistance.

The present invention is equally applicable to PMOS transistors; the conductivity types of the semiconductor and the ion implant types are simply reversed.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
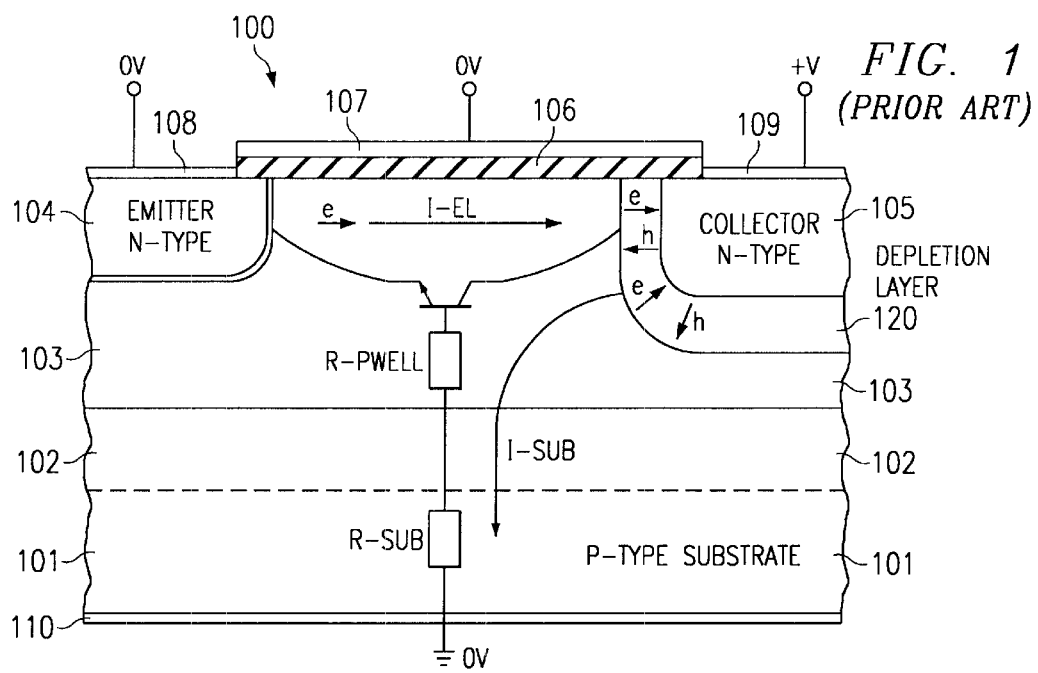
FIG. 1 is a simplified and schematic cross section through a lateral MOS transistor, illustrating the current flow at an electrostatic discharge event.

The impact of the present invention can be most easily appreciated by highlighting the shortcomings of the known technology. The schematic cross section of FIG. 1 illustrates a commonly used integrated circuit (IC) component 100 in an ESD protection circuit, namely an NMOS transistor which operates in the mode of a lateral bipolar npn transistor during an ESD event and provides a low impedance current path to ground. The IC is formed in a semiconductor of a "first conductivity" type; in the example of FIG. 1, this "first conductivity" is p-type, the MOS transistor is an NMOS transistor, and the lateral bipolar transistor is an npn transistor. In present manufacturing, the first conductivity type semiconductor is created by the net doping due to a "substrate" and a "well".

As defined herein, the term "substrate" refers to the starting semiconductor wafer. In present manufacturing, the substrate typically has p-type doping. For clarity, this case is also selected as the basis for the following discussions. It should be stressed, however, that the invention and all description also cover the case where the substrate has n-type doping. In FIG. 1, the substrate is designated 101. Frequently, but not necessarily, an epitaxial layer 102 of the same conductivity type as the substrate has been deposited over the substrate 101; in this case the term "substrate" refers to epitaxial layer 102 plus starting semiconductor 101. For the conductivity example selected for FIG. 1, a p-well 103 has been formed by localized acceptor ion implantation and annealing. An n-plus source region 104 (the emitter of the bipolar transistor) and drain region 105 (the collector of the bipolar transistor) were formed by shallow ion implants of donors. The surface between the emitter 104 and the collector 105 is covered by gate oxide layer 106. Layers 107, 108, 109, and 110 provide metallic contacts to the gate, emitter, collector and the wafer backside, respectively.

FIG. 1 further shows that emitter 108, gate 107 and wafer backside 110 are electrically connected to ground potential. A positive voltage spike at the collector, as caused by an ESD event, applies a reverse bias to the collector/base junction; the base is the substrate 101 (in some devices, epitaxial layer 102 plus the substrate 101); the depletion layer of the space charge region is designated 120. When the electric field in the depletion region 120 exceeds the breakdown field, avalanching occurs and forms electron/hole pairs. Electrons flow into the collector, and holes flow into the p-type base.

This hole current I-sub flows from the collector junction through the substrate to the backside contact 110, causing a voltage drop across the resistors R-pwell and R-sub, which positive (forward) biases the emitter/base junction. This emitter forward bias is proportional to the effective "substrate resistance" equal to the sum of the resistance components in the current path, which are schematically shown as R-pwell and R-sub in FIG. 1. Those of the electrons injected from the emitter into the base which reach the collector depletion layer will participate in the avalanche mechanism.

Figure 2:
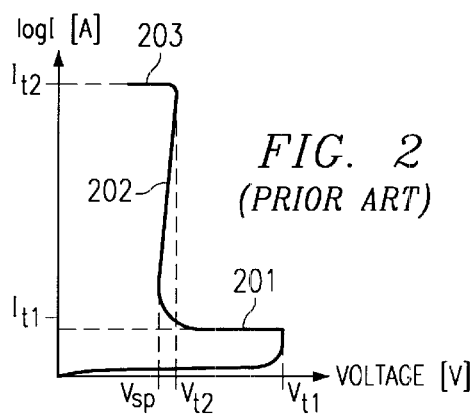
FIG. 2 is a schematic plot of drain (collector) current, on a logarithmic scale, as a function of drain voltage, on a linear scale, illustrating the onset of the second breakdown phenomenon.

The electron concentration will be multiplied in accordance with the electric field dependent avalanche multiplication factor. The resulting reduction of the device impedance is reflected in a "snap back" 201 in the current-voltage characteristic, which corresponds to a "turn on" of the bipolar transistor. FIG. 2 plots the collector (or drain) current I (on a logarithmic scale) as a function of drain voltage V (on a linear scale). As illustrated in FIG. 2, this snap-back 201 occurs at the collector/drain voltage Vt1 with an associated collector/drain current It1. The field dependence of the avalanche multiplication factor is responsible for establishing a new stable current/voltage equilibrium 202. At high electron injection levels, base conductivity modulation also contributes towards making the device impedance positive again. It should be mentioned that the lateral npn transistor also protects against negative ESD pulses. The collector 105 (in FIG. 1) now acts as emitter and diverts the ESD current to the backside substrate contact 110 and to the now reverse biased emitter 104, which now acts as collector.

The current carrying capability of the device is limited by thermal effects in the avalanching collector depletion layer. A number of effects (such as the increase of intrinsic carrier concentration, a reduced carrier mobility, a decrease in thermal conductivity, and a lowering of the potential barrier for tunnel currents) contribute to the onset of the second (thermal) breakdown (203 in FIG. 2). The second breakdown trigger current It2 is very sensitive to the device design, especially the doping profiles. Second breakdown results in junction melting and in an irreversible increase in leakage currents. It must, therefore, be avoided for normal device operation.

It is important for the present invention to conclude from FIG. 1 and the above discussion of FIG. 2 that increasing the resistors R-pwell and/or R-sub will lead to an earlier turn-on of the emitter and to a reduction of the current contribution of the avalanche mechanism. This is reflected in an increase of the second breakdown threshold current It2. As was pointed out in the above-referenced publication by K. Bock et al., the p-well resistance R-pwell, and thus It2, can be modified by the p-well doping. However, known technology recommended only a lower substrate (or epitaxial) doping or a lower implant dose as methods to increase the p-well resistance.

The structure of the modified p-well doping and p-well resistance R-pwell according to the present invention are described in FIGS. 3 to 10, and the flexible and economical method for tailoring R-pwell according to the invention is described in FIGS. 11 to 16. While the examples depicted embody the experimental conditions for an NMOS transistor, analogous considerations hold for the conditions of a PMOS transistor.

Figure 3:
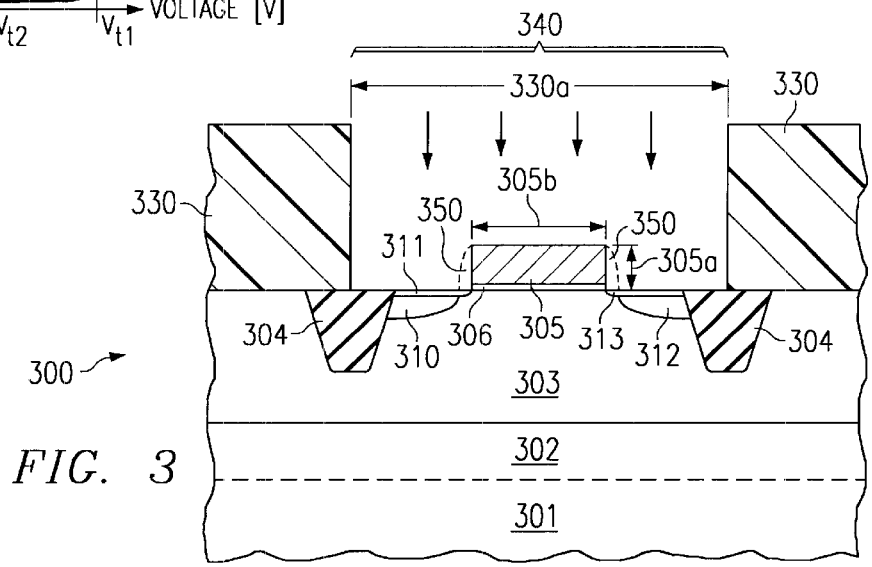
FIG. 3 schematically presents a cross section of a lateral MOS transistor with a photoresist window opened for the high energy ion implant according to the first embodiment of the invention.

FIG. 3 shows in simplified and schematic (not to scale) manner a small portion of an IC having on its surface an MOS transistor, generally designated 300, at a certain stage of its fabrication process according to the invention. The invention applies to NMOS as well as PMOS transistors fabricated into semiconductor substrate material. Here, the substrate comprises a semiconductor wafer 301 of p-type doping (onto which, for some devices, an epitaxial layer 302, also of p-type doping, has been deposited). For clarity, the description and discussion of the invention will be for a p-type semiconductor. However, the invention is also applicable if an n-type substrate is used. The semiconductor material may be silicon, silicon germanium, gallium arsenide or any other semiconductor material used in IC fabrication.

The resistivity of the semiconductor substrate, into which the MOS transistor is fabricated, ranges from about 1 to 50 $\Omega$cm (this is also the resistivity of the epitaxial layer). A well 303 of a "first" conductivity type has been fabricated into the substrate. For an NMOS transistor, this "first" conductivity refers to p-type, for a PMOS transistor, to n-type. Silicon dioxide isolation trenches 304 define the active area of the lateral transistor within the p-well. For the gate 305 of the MOS transistor, polysilicon or another conductive material is usually chosen; its thickness 305a is commonly between 140 and 180 nm, and the width 305b between 0.2 and 1.0 $\mu$m. The gate insulator 306 (silicon dioxide, nitrided SiO2, or others) has a physical thickness between 1 and 10 nm.

FIG. 3 shows a deep source 310 and an extended source 311, further a deep drain 312 and an extended drain 313. The extended source and drain are prepared by low-energy, shallow implants (depth typically between 25 and 40 nm), the deep source and drain by medium-energy implants (depth typically between 100 and 140 nm) as part of the process flow shown in FIGS. 11 to 16. For the fabrication by ion implantation, a window 330a in a photoresist layer 330 is used; window 330a determines the lateral extent and active area of the MOS transistor. The same photoresist and window are used for the high-energy implant 340 of the present invention. This implant is performed for modifying the well resistivity within the opening of window 330a to an average value at least an order of magnitude higher than the resistivity value of the semiconductor of the first conductivity type. The thickness, however, of the photoresist layer 330 is larger than the thickness solely required to block the lower energy implants. Preferably, the photoresist layer thickness is between 1.5 and 2.0 $\mu$m. It the high-energy implant accompanies the medium-energy implant, non-conductive sidewalls 350 are typically present as part of the gate structure. For the options in the process flow, see below.

For NMOS transistors, the semiconductor well and substrate of the first conductivity type (p-type) (including any epitaxial layer) has dopant species selected from a group consisting of boron, aluminum, gallium, and indium. Source, drain, their extensions, and the region of higher resistivity within the semiconductor of the first conductivity type have a dopant species selected from a group consisting of arsenic, phosphorus, antimony, and bismuth.

For PMOS transistors, the semiconductor well of the first conductivity type (n-type) has dopant species selected from a group consisting of arsenic, phosphorus, antimony, and bismuth. Source, drain, their extensions, and the region of higher resistivity within the semiconductor of the first conductivity type have a dopant species selected from a group consisting of boron, aluminum, gallium, indium, and lithium.

Figure 4:
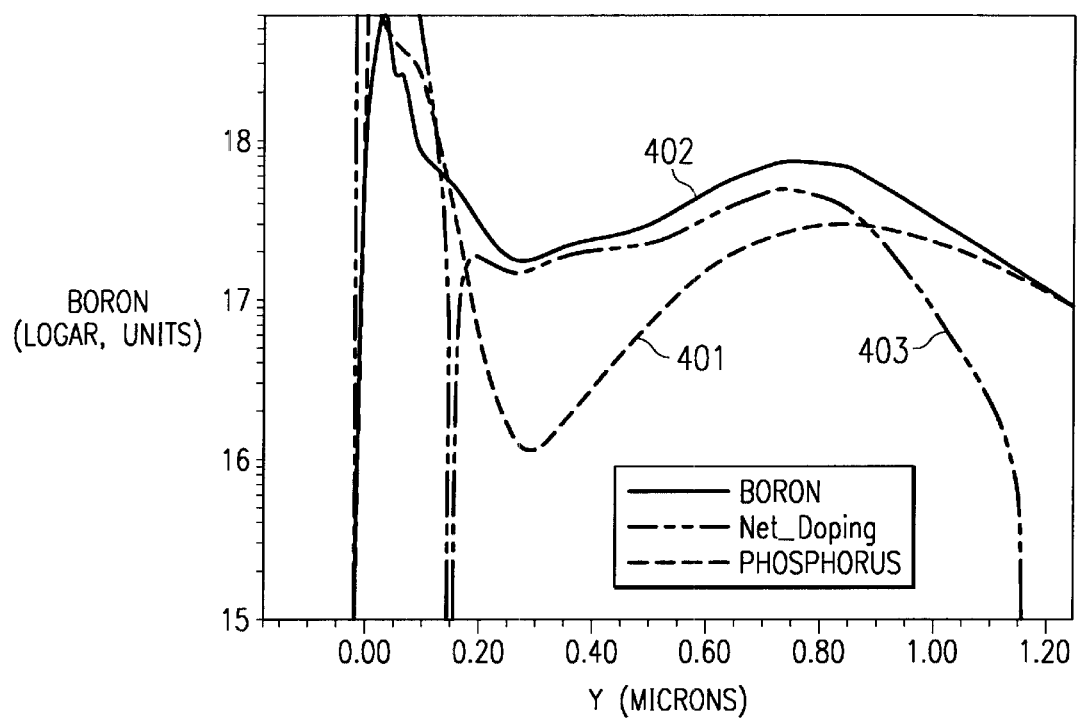
FIG. 4 plots the doping profiles under source and drain of an NMOS transistor before and after a high-energy n-type implant according to the first embodiment of the invention.
Figure 5:
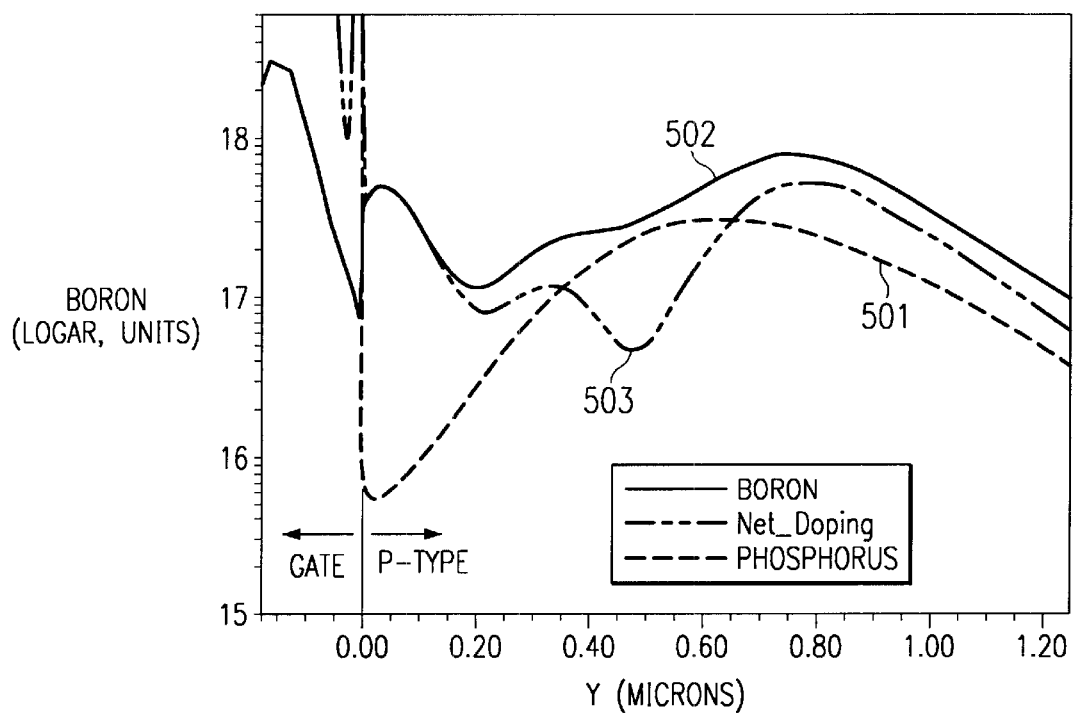
FIG. 5 plots the doping profiles under the gate of an NMOS transistor before and after a high-energy n-type implant according to the first embodiment of the invention.

By way of example for an NMOS transistor, FIGS. 4 and 5 depict the doping profiles resulting from the high-energy n-doping implant of the present invention, as simulated by computer programs. The figures show the profiles of phosphorus implants at 675 keV energy and 2 E13 cm−2 dose into boron-doped silicon substrate material. The ordinates in both figures plot the doping concentrations on logarithmic scale, and the abscissa show the penetration depths into the semiconductor surface, expressed in $\mu$m. In addition to the starting boron and the implanted phosphorus concentrations, the resulting net doping is illustrated. FIG. 4 provides the profiles under the deep source and drain (as illustrated in FIG. 3), and FIG. 5 provides the profiles under the poly-silicon gate.

As can be seen in FIG. 4, the counterdoping of the high-energy phosphorus (curve 401) into the original boron doping (curve 402) of the p-type substrate material results in a substantially lowered net doping (curve 403). Consequently, the resulting resistivity is increased. In this example, the resulting resistivity is in first order uniform between a depth of 0.2 to 0.8 $\mu$m.

The computer simulation in FIG. 5 indicates that the same phosphorus counterdoping (curve 501) as in FIG. 4 into the original p-type boron doping (curve 502) results in an even lower net doping (still p-type, curve 503) under the gate. There is, of course, no junction under the gate; the gate is heavily doped with phosphorus by an independent process step during formation of the gate.

Figure 6:
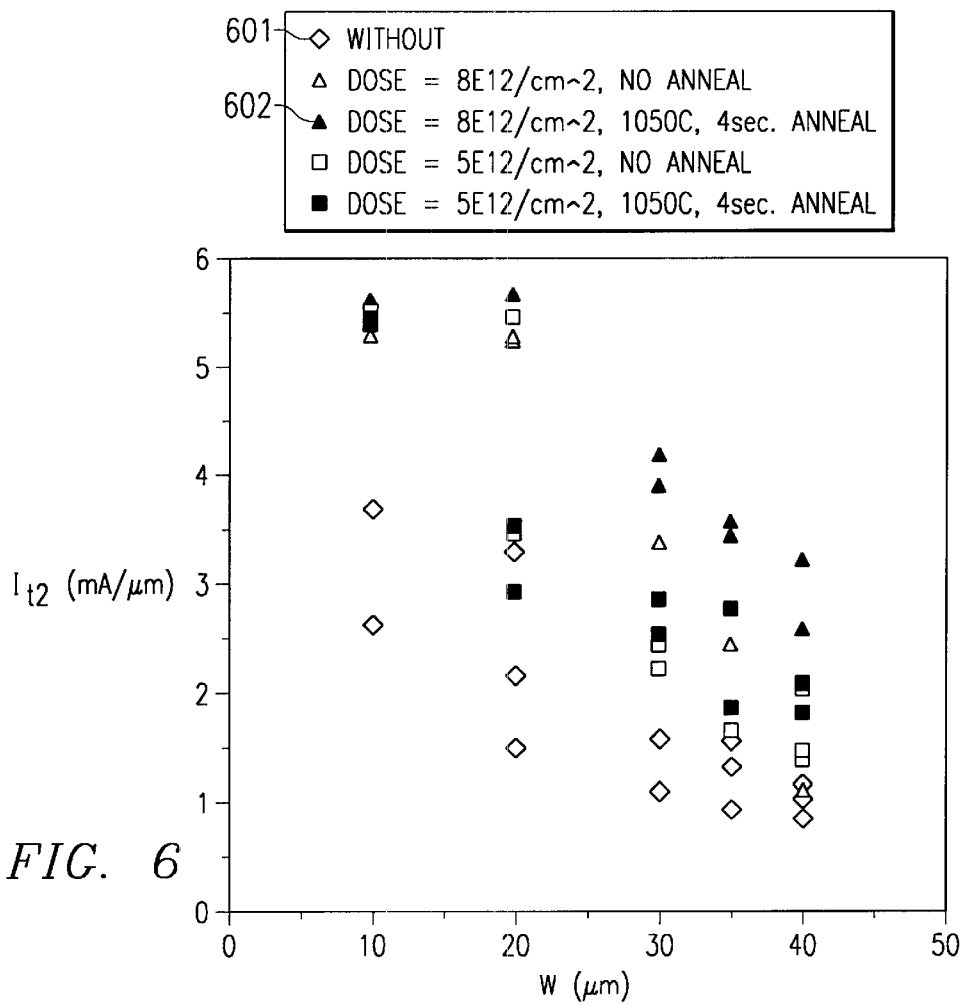
FIG. 6 presents the second breakdown threshold current as a function of transistor width, for several values of n-type ion implant dose according to the first embodiment of the invention.
Figure 7:
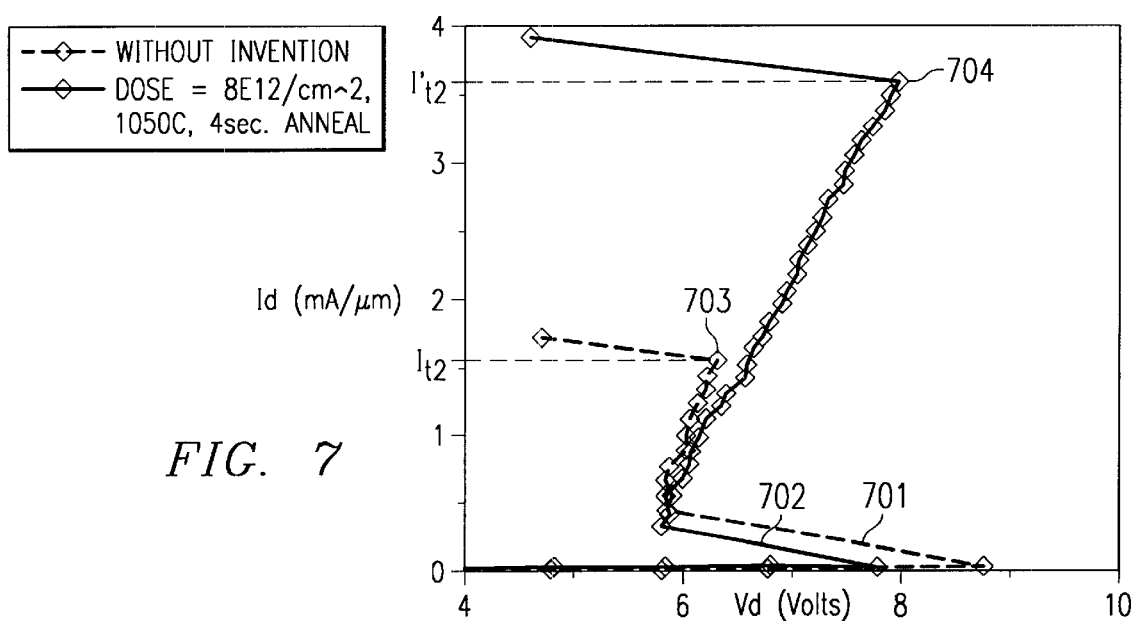
FIG. 7 depicts the measured high-current I-V characteristics of a lateral MOS transistor without and with compensating ion implant according to the invention.

The dramatic improvement of ESD robustness due to the counterdoping method of the present invention is highlighted by the example of the actual data of FIGS. 6 and 7. FIG. 6 summarizes several counterdoping, high-energy phosphorus ion implants into p-type boron substrate silicon. The phosphorus is implanted at the energy of 450 keV. Plotted is the measured second breakdown threshold current It2 (expressed in mA/$\mu$m) as a function of the transistor channel width W (expressed in $\mu$m). Diamond data 601 indicate measurements without counterdoping implant.

The implants (triangle and square data) are performed at two different doses, with and without annealing after the implant. The most favorable results were obtained by the implant represented by the triangles designated 602. This implant condition has a dose of 8 E12 cm−2, followed by an anneal at 1050° C. for 4 s.

The impact of this particular implant condition is represented by the data of the curves in FIG. 7. Plotted is drain current Id, measured in mA/$\mu$m, as a function of drain voltage Vd, measured in V. In contrast to FIG. 2, Id in FIG. 7 is plotted linearly. Dotted curve 701 refers to results without the benefit of the counterdoping implant of the present invention, solid curve 702 refers to the phosphorus implant at energy 450 keV, dose 8 E12 cm−2, and anneal at 1050° C. for 4 s. The Id-value I't2, observed with implant (point 704), is considerably higher than the Id-value It2 without implant (point 703). The lowering of the net p-type doping in the p-well, i.e. the increase of p-well resistance, based on the additional high-energy phosphorus ion implant of the invention, led to an It2 improvement of more than a factor of 2. Consequently, the additional ion implant of the invention enhanced significantly the ESD robustness of the MOS transistor.

Figure 8:
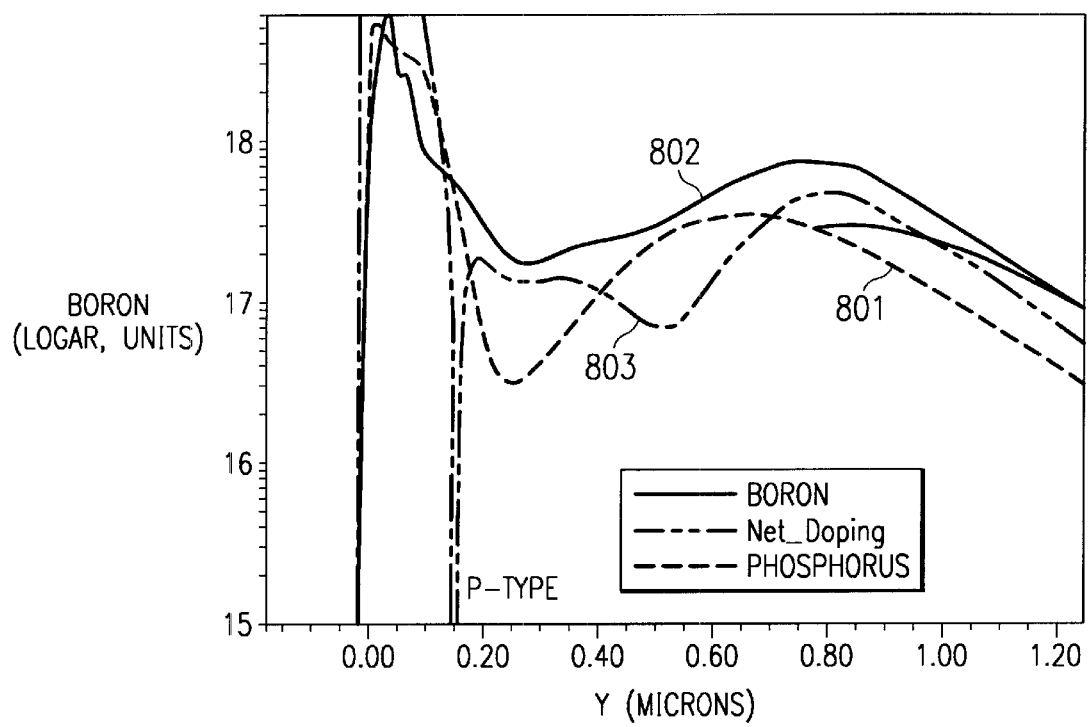
FIG. 8 plots the doping profiles under source and drain of an NMOS transistor before and after a high-energy n-type implant according to the second embodiment of the invention.

Another embodiment of the invention is illustrated in FIGS. 8, 9, and 10, again using an NMOS transistor as an example. This embodiment illustrates the great versatility of the invention. The effective p-type boron doping of the p-well in FIGS. 8 (curve 802) and 9 (curve 902) is the same as the boron doping in FIGS. 4 (curve 402) and 5 (curve 502), respectively. The counterdoping phosphorus implant, however, is selected at a somewhat reduced energy (500 keV in FIGS. 8 and 9, versus 675 keV in FIGS. 4 and 5), at the same dose of 2 E13 cm−2. Consequently, the peak penetration is somewhat less deep under the surface. In FIG. 8 (doping under deep source/drain), curve 801, the peak phosphorus penetration is in the range of 0.5 to 0.7 $\mu$, as compared to 0.7 to 0.9 $\mu$m for curve 401 in FIG. 4. The net doping, though, curve 803, is not substantially different from the net doping achieved in FIG. 4, curve 403.

Figure 9:
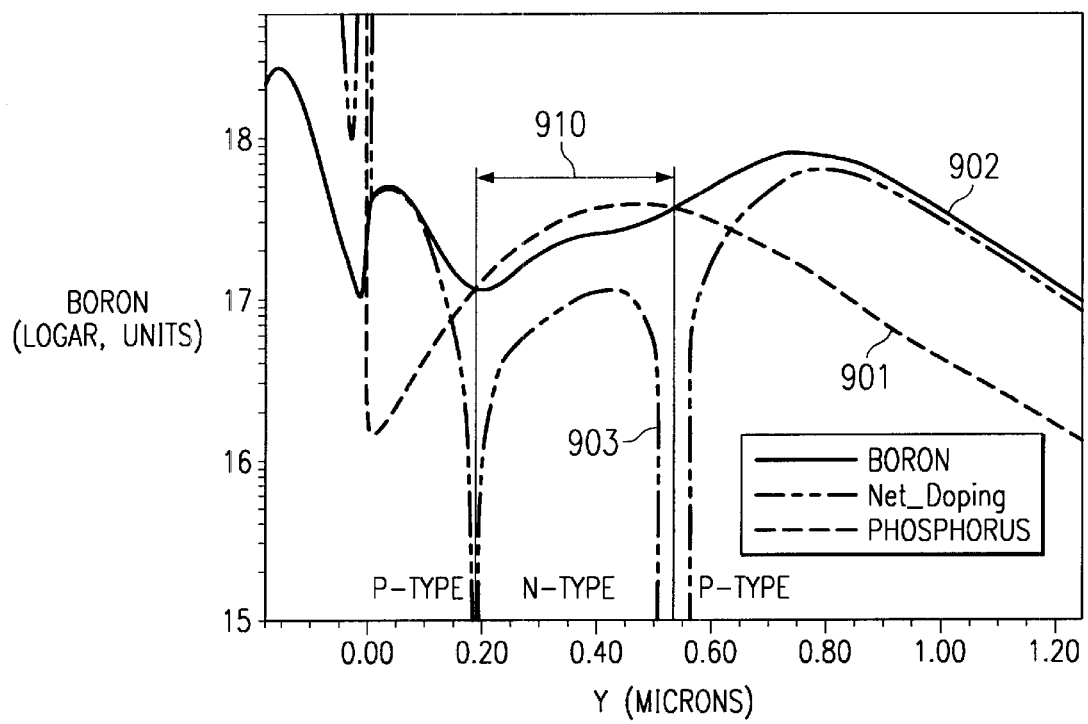
FIG. 9 plots the doping profiles under the gate of an NMOS transistor before and after a high-energy n-type implant according to the second embodiment of the invention.

In contrast, as illustrated in FIG. 9, the shallower penetration depth of the phosphorus doping peak (curve 901) has a significant effect under the poly-silicon gate. In the region 910, stretching approximately from 0.2 $\mu$m to 0.5 $\mu$m depth, the phosphorus doping overcompensates the boron doping (curve 902), leading to a localized slightly n-type region embedded within the p-well.

Figure 10:
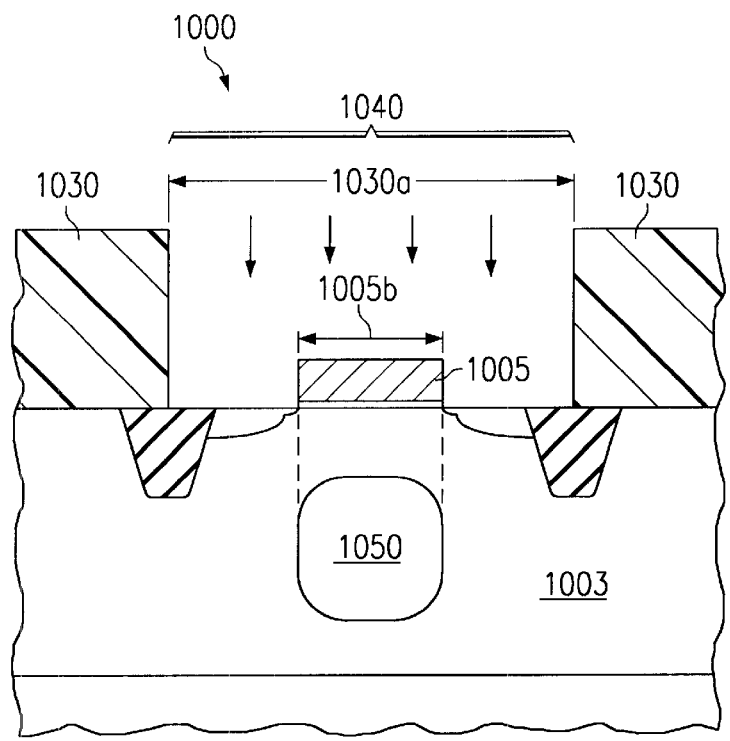
FIG. 10 schematically presents a cross section of a lateral MOS transistor with a photoresist window opened for the high-energy ion implant according to the second embodiment of the invention.

This phenomenon is schematically depicted by the NMOS transistor in FIG. 10 (generally designated 1000; not to scale), which is analogous to FIG. 3. The phosphorus implant 1040 (energy 500 keV and dose 2 E13 cm−2) through the window 1030a of the photoresist layer 1030 into the p-well 1003 results in the volume 1050 having an n-type conductivity opposite to the p-well conductivity. Volume 1050 is located vertically under gate 1005 at a depth determined by the implant energy. The lateral extent of volume 1050 is approximately equal to the width 1005b of gate 1005. The precise boundaries of volume 1050 are determined by the detailed superposition of the doping profiles of the p-well and the compensating ion implant. The ESD impact of the appearance of volume 1050 derives from the fact that volume 1050 further impedes the flow of substrate current of transistor 1000.

The method and process flow for fabricating an IC MOS transistor with increased substrate resistance is outlined in the schematic and simplified FIGS. 11 to 16 for the example of an NMOS transistor; analogous process steps apply for the fabrication of a PMOS transistor.

Figure 11:
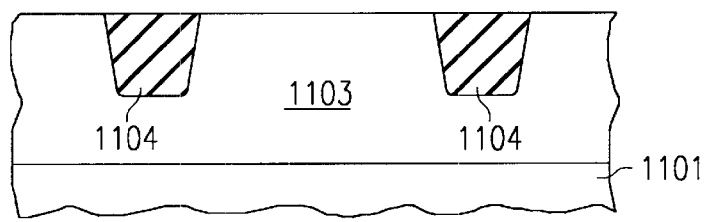
FIGS. 11 to 16 are schematic and simplified cross sections of an MOS transistor illustrating individual process steps in the fabrication flow according to the invention.
Figure 12:
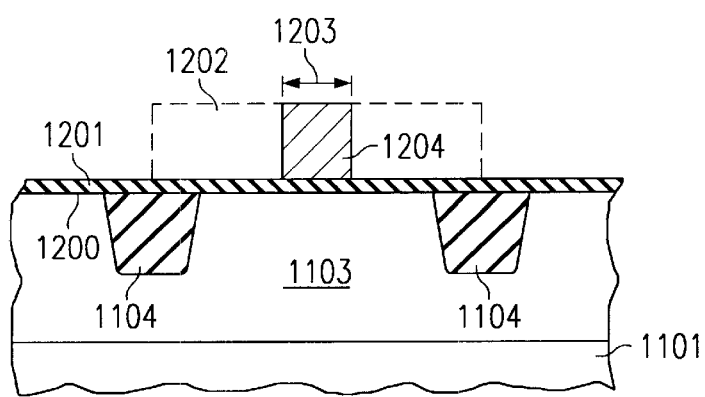
Figure 13:
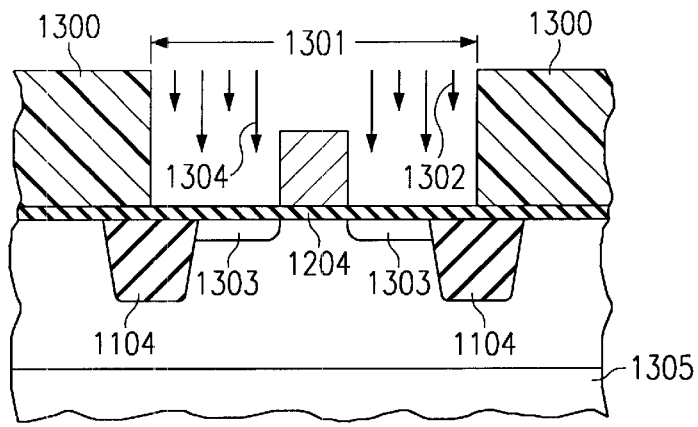
Figure 14:
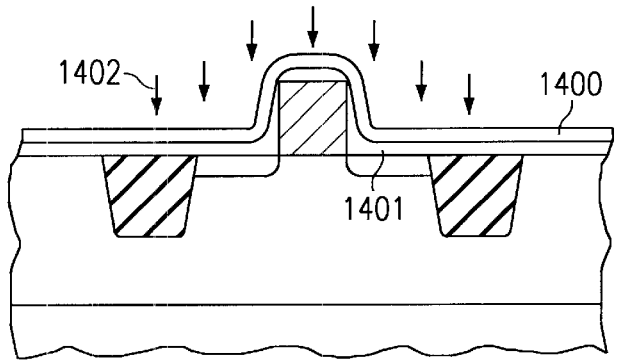
Figure 15:
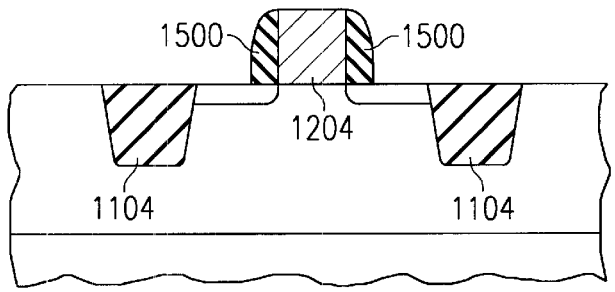
Figure 16:
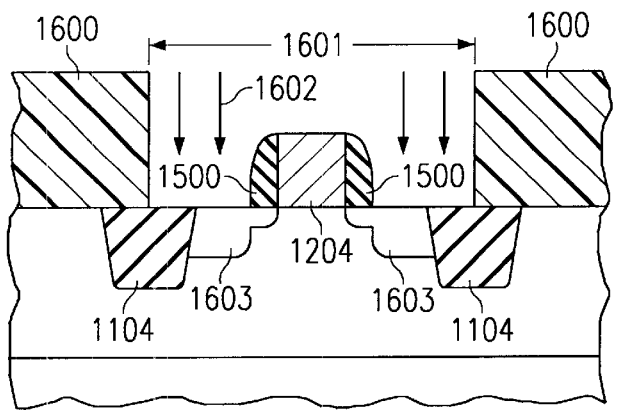

FIG. 11: selecting a p-type semiconductor 1101 as substrate; may be an epitaxial material;

FIG. 11: forming non-conductive electrical isolation regions 1104 into p-type semiconductor 1101 for defining the lateral boundaries of the NMOS transistor active area;

FIG. 11: implanting p-doping or n-doping ions to adjust the background doping level of semiconductor 1101 to form the p-well region 1103 to a predetermined peak doping concentration (for instance, between 4·10E17 and 1·10E18 cm−3);

FIG. 12: depositing over surface 1200 a layer 1201 of insulating material suitable as gate dielectric, covering the transistor area;

FIG. 12: depositing a layer 1202 of poly-silicon or other conductive material onto insulating layer 1201;

FIG. 12: protecting a portion of poly-silicon 1202 and etching the remainder thereof, defining the gate area 1203 of the gate 1204 of the transistor;

FIG. 13: depositing a first photoresist layer 1300 in a thickness (about 1.5 $\mu$m) larger than the thickness solely required to block the low-energy ion implant. Opening a window 1301 in layer 1300, exposing the surface of the transistor area between the isolation regions 1101;

FIG. 13: implanting, at low energy, n-doping ions 1302 into the exposed surface area, creating shallow n-doped layers 1303 under the surface, suitable as extended source and drain of the transistor. The energy of these ions is selected to create the junction at a depth between 10 and 50 nm; the peak concentration is between about $5 \cdot 10E17$ and $5 \cdot 10E20$ cm−3;

FIG. 13: implanting, at high energy, n-doping ions 1304 into the exposed surface area, creating a deep region 1305 under the surface having a net p-type doping lower than that of the p-type semiconductor remote from the transistor active area. The energy of these ions is between about 400 and 550 keV, the dose between $5 \cdot 10E12$ and $2 \cdot 10E13$ cm−2, achieving a concentration from about $1 \cdot 10E17$ to $6 \cdot 10E17$ cm−3 at a depth of more than 200 nm. Annealing the high-energy ion implant, for instance at 1050° C. for 4 s The net p-type doping of low concentration comprises a peak concentration of about 1 to 6 E17 cm−3 below the p-n junctions of the transistor's deep source and drain regions;

FIG. 13: removing the first photoresist layer 1300;

FIGS. 14 and 15: depositing conformal insulating layers 1400 and 1401 of an insulator, such as silicon nitride or silicon dioxide, over the surface, and directional plasma etching (1402) these insulating layers so that only side walls 1500 around the poly-silicon gate 1204 remain;

FIG. 16: depositing a second photoresist layer 1600 and opening a window 1601 therein, exposing the surface of the area between the isolation regions 1101;

FIG. 16: implanting, at medium energy, n-doping ions 1602 into the exposed surface area, creating an n-doped region 1603 that extends to a medium depth under the surface, suitable as deep source and drain of the transistor. The energy of these ions is selected to create the junction at a depth between 50 and 200 nm; the peak concentration is between about $5 \cdot 10E19$ and $5 \cdot 10E20$ cm−3;

FIG. 16: removing the second photoresist layer 1600.

In the above process flow, the inventive step of implanting the n-doping ions at high energy can be performed either at the step shown in FIG. 13, in sequence with the low-energy implant, or at the step shown in FIG. 16, in sequence with the medium-energy implant.

In order to overcompensate the p-type semiconductor doping and create a volume of opposite conductivity type embedded in the p-well (second embodiment of the invention, see FIG. 10), the high-energy ion implant is selected at an energy between 400 and 700 keV for a peak concentration at a different depth than that of the p-type semiconductor; dose range about $8 \cdot 10E12$ and $8 \cdot 10E13$ cm−2.

For fabricating a PMOS transistor according to the method of the present invention, the flow of the above process steps applies in analogous fashion with a reversal of conductivity types.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. An integrated circuit fabricated in a semiconductor of a first conductivity type, said circuit having at the surface at least one lateral MOS transistor comprising:

a source and a drain, each having at said surface a region of the opposite conductivity type extending to the centrally located gate, defining the active area of said transistor; and a semiconductor region within said semiconductor of said first conductivity type, having a resistivity higher than the remainder of said semiconductor, said region extending vertically below said transistor while laterally limited to the area of the transistor, and embedded in said region a volume of said opposite conductivity type, said volume thereby further impeding the flow of substrate current from said transistor.

2. The circuit according to claim 1 wherein said semiconductor of the first conductivity type is a semiconductor epitaxial layer.

3. An integrated circuit fabricated in a semiconductor of a first conductivity type, said circuit having at the surface at least one lateral MOS transistor comprising:

a source and a drain, each having at said surface a region of the opposite conductivity type extending to the centrally located gate, defining the active area of said transistor;

a semiconductor region within said semiconductor of said first conductivity type, having a resistivity higher than the remainder of said semiconductor, said region extending vertically below said transistor while laterally limited to the area of the transistor such that the resistivity under said gate is different from the resistivity under said source and drain regions; and said semiconductor of the first conductivity type is made of p-type silicon in the resistivity range from about 1 to 50 Ωcm, and said source, drain, and their extensions are made of n-type silicon.

4. An integrated circuit fabricated in a semiconductor of a first conductivity type, said circuit having at the surface at least one lateral MOS transistor comprising:

a source and a drain, each having at said surface a region of the opposite conductivity type extending to the centrally located gate, defining the active area of said transistor;

a semiconductor region within said semiconductor of said first conductivity type, having a resistivity higher than the remainder of said semiconductor, said region extending vertically below said transistor while laterally limited to the area of the transistor such that the resistivity under said gate is different from the resistivity under said source and drain regions; and said semiconductor of the first conductivity type has a dopant species selected from a group consisting of boron, aluminum, gallium, and indium, while said source, drain, their extensions, and said region of higher resistivity within said semiconductor of the first conductivity type have a dopant species selected from a group consisting of arsenic, phosphorus, antimony, and bismuth.

5. An integrated circuit fabricated in a semiconductor of a first conductivity type, said circuit having at the surface at least one lateral MOS transistor comprising:

a source and a drain, each having at said surface a region of the opposite conductivity type extending to the centrally located gate, defining the active area of said transistor;

a semiconductor region within said semiconductor of said first conductivity type, having a resistivity higher than the remainder of said semiconductor, said region extending vertically below said transistor while laterally limited to the area of the transistor such that the resistivity under said gate is different from the resistivity under said source and drain regions; and said semiconductor of the first conductivity type is made of n-type silicon in the resistivity range from about 5 to 50 Ωcm, and said source, drain, and their extensions are made of p-type silicon.

6. An integrated circuit fabricated in a semiconductor of a first conductivity type, said circuit having at the surface at least one lateral MOS transistor comprising:

a source and a drain, each having at said surface a region of the opposite conductivity type extending to the centrally located gate, defining the active area of said transistor;

a semiconductor region within said semiconductor of said first conductivity type, having a resistivity higher than the remainder of said semiconductor, said region extending vertically below said transistor while laterally limited to the area of the transistor such that the resistivity under said gate is different from the resistivity under said source and drain regions; and said semiconductor of the first conductivity type has a dopant species selected from a group consisting of arsenic, phosphorus, antimony, bismuth, and lithium, while said source, drain, their extensions, and said region of higher resistivity within said semiconductor of the first conductivity type have a dopant species selected from a group consisting of boron, aluminum, gallium, indium, and lithium.

7. An intergrated circuit fabricated in a semiconductor of a first conductivity type, said circuit having at the surface at least one lateral MOS transistor comprising:

a source and a drain, each having at said surface a region of the opposite conductivity type extending to the centrally located gate, defining the active area of said transistor;

a semiconductor region within said semiconductor of said first conductivity type, having a resistivity higher than the remainder of said semiconductor, said region extending vertically below said transistor while laterally limited to the area of the transistor such that the resistivity under said gate is different from the resistivity under said source and drain regions; and said gate has a narrow dimension from about 0.2 to 1.0 μm.

8. An ESD protection circuit fabricated in a semiconductor of a first conductivity type, said circuit having at the surface at least one lateral MOS transistor comprising:

a source and a drain, each having at said surface a region of the opposite conductivity type extending to the centrally located gate, defining the active area of said transistor;

a semiconductor region within said semiconductor of said opposite conductivity type, having a resistivity higher than the remainder of said semiconductor, said region extending vertically below said transistor while laterally limited to the area of the transistor gate such that the resistivity under said gate is different from the resistivity under said source and drain regions; and said region of higher resistivity is the substrate of said transistor, enabling full functioning of said transistor while not affecting operation of neighboring active devices.

9. An ESD protection circuit fabricated in a semiconductor of a first conductivity type, said circuit having at the surface at least one lateral MOS transistor comprising:

a source and a drain, each having at said surface a region of the opposite conductivity type extending to the centrally located gate, defining the active area of said transistor;

a semiconductor region within said semiconductor of said opposite conductivity type, having a resistivity higher than the remainder of said semiconductor, said region extending vertically below said transistor while laterally limited to the area of the transistor gate such that the resistivity under said gate is different from the resistivity under said source and drain regions;

said region of higher resistivity is the substrate of said transistor, enabling full functioning of said transistor while not affecting operation of neighboring active devices; and said region of higher resistivity further improves the ESD protection of said transistor without decreasing latch-up robustness or increasing inadvertent substrate current-induced body biasing of neighboring transistors.

* * * * *